United States Patent
Beer et al.

(10) Patent No.: US 6,215,897 B1
(45) Date of Patent: Apr. 10, 2001

(54) AUTOMATED SUBSTRATE PROCESSING SYSTEM

(75) Inventors: Emanuel Beer, San Jose; John M. White, Hayward, both of CA (US)

(73) Assignee: Applied Komatsu Technology, Inc., Tokyo (JP)

(*) Notice: Subject to any disclaimer, the term of this patent is extended or adjusted under 35 U.S.C. 154(b) by 0 days.

(21) Appl. No.: 09/082,413

(22) Filed: May 20, 1998

(51) Int. Cl.⁷ ........................................ G06K 9/00
(52) U.S. Cl. ........................ 382/151; 382/149; 348/87
(58) Field of Search ................... 382/145, 149, 382/151, 153; 395/89, 88, 93; 438/716, 908; 414/416, 217, 273, 744.1, 806; 118/715, 719, 729; 348/86, 87, 125, 126; 700/254, 258

(56) References Cited

U.S. PATENT DOCUMENTS

| | | | |
|---|---|---|---|
| 4,618,938 | * 10/1986 | Sandland et al. | 364/552 |
| 4,951,601 | 8/1990 | Maydan et al. | |
| 5,195,234 | 3/1993 | Pine et al. | |
| 5,274,434 | 12/1993 | Morioka et al. | |
| 5,352,294 | 10/1994 | White et al. | |
| 5,535,306 | 7/1996 | Stevens | |
| 5,536,128 | 7/1996 | Shimoyashiro et al. | 414/273 |
| 5,537,311 | 7/1996 | Stevens | |
| 5,611,865 | 3/1997 | White et al. | |
| 5,690,744 | 11/1997 | Landau | |
| 5,696,835 | 12/1997 | Hennessey et al. | |
| 5,700,127 | * 12/1997 | Harada et al. | 414/416 |
| 5,917,601 | * 6/1999 | Shimazaki et al. | 356/375 |
| 5,933,521 | * 8/1999 | Pasic | 382/145 |

FOREIGN PATENT DOCUMENTS

| | | |
|---|---|---|
| 0312046A2 | 4/1989 | (EP) . |
| 0405301A2 | 1/1991 | (EP) . |
| 63-141342 | 6/1988 | (JP) . |
| 3-136345 | 6/1991 | (JP) . |
| WO 97/35241 | 3/1997 | (WO) . |

OTHER PUBLICATIONS

PCT International Search Report Dated Oct. 26, 1999.

* cited by examiner

Primary Examiner—Bhavesh Mehta
(74) Attorney, Agent, or Firm—Thomason, Moser & Patterson, LLP

(57) ABSTRACT

A substrate handling apparatus includes a transfer arm having a substrate support. The apparatus includes at least one image acquisition sensor configured to acquire images of a substrate supported by the substrate support. In addition, the apparatus includes a controller coupled to the image acquisition sensor and configured to control the image acquisition sensor to acquire at least one image of the substrate supported on the substrate support. The controller is further configured to receive the images acquired by the image acquisition sensor and to determine an initial position of the substrate based on the acquired images. The controller is further coupled to the substrate support to control movement thereof to move the substrate to a new position based on the substrate's initial position. The apparatus also can be used to determine a substrate identification and to detect certain substrate defects either before or after processing the substrate in a thermal processing chamber. A method of positioning a substrate on a transfer arm also is disclosed.

17 Claims, 15 Drawing Sheets

AUTOMATED SUBSTRATE PROCESSING SYSTEM

RELATED APPLICATIONS

The present application is related to U.S. patent application Ser. No. 08/946,922, filed Oct. 8, 1997, now abandoned and entitled "Modular On-Line Processing System," as well as the following U.S. patent applications which are being filed concurrently with this application: (1) "Method and Apparatus for Substrate Transfer and Processing"; (2) "Isolation Valves,"; (3) "Multi-Function Chamber For A Substrate Processing System,"; (4) "Substrate Transfer Shuttle Having a Magnetic Drive,"; (5) "Substrate Transfer Shuttle, "; (6) "In-Situ Substrate Transfer Shuttle,"; and (7) "Modular Substrate Processing System,".

The foregoing patent applications, which are assigned to the assignee of the present application, are incorporated herein by reference in their entirety.

BACKGROUND

The present invention relates generally to an automated substrate processing system, and, in particular, to techniques for improving substrate alignment and detecting substrate defects using image acquisition sensors.

Glass substrates are being used for applications such as active matrix television and computer displays, among others. Each glass substrate can form multiple display monitors each of which contains more than a million thin film transistors.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

The glass substrates can have dimensions, for example, of 550 mm by 650 mm. The trend is toward even larger substrate sizes, such as 650 mm by 830 mm and larger, to allow more displays to be formed on the substrate or to allow larger displays to be produced. The larger sizes place even greater demands on the capabilities of the processing systems.

Some of the basic processing techniques for depositing thin films on the large glass substrates are generally similar to those used, for example, in the processing of semiconductor wafers. Despite some of the similarities, however, a number of difficulties have been encountered in the processing of large glass substrates that cannot be overcome in a practical way and cost effectively by using techniques currently employed for semiconductor wafers and smaller glass substrates.

For example, efficient production line processing requires rapid movement of the glass substrates from one work station to another, and between vacuum environments and atmospheric environments. The large size and shape of the glass substrates makes it difficult to transfer them from one position in the processing system to another. As a result, cluster tools suitable for vacuum processing of semiconductor wafers and smaller glass substrates, such as substrates up to 550 mm by 650 mm, are not well suited for the similar processing of larger glass substrates, such as 650 mm by 830 mm and above. Moreover, cluster tools require a relatively large floor space.

Similarly, chamber configurations designed for the processing of relatively small semiconductor wafers are not particularly suited for the processing of these larger glass substrates. The chambers must include apertures of sufficient size to permit the large substrates to enter or exit the chamber. Moreover, processing substrates in the process chambers typically must be performed in a vacuum or under low pressure. Movement of glass substrates between processing chambers, thus, requires the use of valve mechanisms which are capable of closing the especially wide apertures to provide vacuum-tight seals and which also must minimize contamination.

Furthermore, relatively few defects can cause an entire monitor formed on the substrate to be rejected. Therefore, reducing the occurrence of defects in the glass substrate when it is transferred from one position to another is critical. Similarly, misalignment of the substrate as it is transferred and positioned within the processing system can cause the process uniformity to be compromised to the extent that one edge of the glass substrate is electrically non-functional once the glass has been formed into a display. If the misalignment is severe enough, it even may cause the substrate to strike structures and break inside the vacuum chamber.

Other problems associated with the processing of large glass substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the glass substrate combined with its size, therefore, makes it more difficult to obtain uniform characteristics for the electronic components formed on different portions of the surface of a processed substrate. Moreover, heating or cooling the substrates quickly and uniformly is more difficult as a consequence of its poor thermal conductivity, thereby reducing the ability of the system to achieve a high throughput.

Automated substrate processing systems typically include one or more transfer mechanisms, such as robotic devices or conveyors, for transferring substrates between different parts of the processing system. For example, one transfer mechanism may transfer substrates one at a time between a cassette and a load lock chamber. A second transfer mechanism may transfer substrates between the load lock chamber and the vacuum chamber where the substrate is subjected to various processing steps.

Each time a substrate is transferred automatically from to or from a chamber, the substrate may become misaligned with respect to components within the chamber or with respect to other system components. In general, alignment errors accumulate as the substrate is transferred through the processing system. If the degree of misalignment is too great, the quality of the processed substrate can become significantly degraded, or the substrate might break. When a substrate breaks inside a vacuum chamber, the chamber must be opened and exposed to atmospheric pressure, the chamber must be cleaned, and the chamber must be pumped back down to a sub-atmospheric pressure suitable for processing. Such a procedure may take up to twenty-fours to complete, thereby significantly reducing the time during which the system can be used to process substrates.

SUMMARY

In general, in one aspect, a substrate handling apparatus includes a transfer arm or conveyor having a substrate support, and at least one image acquisition sensor configured to acquire images of a substrate supported by the substrate support. The substrate handling apparatus also can include a controller coupled to the image acquisition sensor and configured to control the image acquisition sensor to acquire one or more images of the substrate supported on the substrate support. The controller is further configured to receive the image(s) acquired by the image acquisition sensors and to determine an initial position of the substrate based on the acquired image(s). The controller also is coupled to the substrate support to control movement thereof to move the substrate to a new position based on the substrate's initial position.

In another aspect, a method of positioning a substrate includes supporting the substrate on a substrate support of a transfer arm and acquiring at least one image of the substrate supported on the substrate support. The method further includes determining an initial position of the substrate based on the acquired image(s) and moving the substrate support based on the initial position to adjust for a misalignment of the substrate.

Various implementations include one or more of the following features. The substrate handling apparatus can include an automatic atmospheric or vacuum transfer arm or conveyor that includes one or more blades to support the substrate. The image acquisition sensor(s) can include an array of charge coupled devices or other cameras. Each image acquisition sensor can be controlled to take one or more images of the substrate.

The substrate handling apparatus can include a light source to enhance a quality of images acquired by the image acquisition sensor(s). In some implementations, the light source can include an incandescent light source or a strobe lamp.

The substrate handling apparatus can be configured so that the acquired image(s) includes a portion of at least one edge of the substrate. The acquired images can include respective portions of adjacent edges of the substrate or a corner of the substrate.

The controller can be configured to apply an edge detection or other specific template algorithm to the acquired images. An initial angular orientation of the substrate can be determined based on the acquired image(s). The apparatus can include a memory associated with the controller, wherein the memory stores ideal information indicative of an ideal substrate position, and wherein the controller is further configured to compare the initial substrate position to the ideal substrate position.

In addition, the controller can be configured to control movement of the substrate support to adjust the angular orientation or the linear horizontal translation of the substrate in response to determining the substrate's initial angular orientation. The angular orientation and the linear horizontal translation of the substrate support can be controlled to correct a misalignment of the substrate based on the substrate's initial position. In some implementations, the substrate is transferred to a processing chamber or to a load lock chamber after moving the substrate support to adjust for the misalignment. Additionally, in some implementations, the substrate support is moved to adjust for the misalignment after removing the substrate from a processing chamber or after removing the substrate from a load lock chamber.

If the substrate includes a substrate identification, one of the acquired images can capture the identification, and a character recognition algorithm can be performed to interpret the substrate identification.

In some implementations, the substrate support is translated vertically while the substrate is supported thereon, and an image that includes substantially an entire surface of the substrate can be acquired. A determination can be made as to whether defects exist in the substrate based on one or more images of the substrate surface. The defect detection can be performed either before or after processing of the substrate.

Various implementations include one or more of the following advantages. Large substrates, such as glass substrates, used during the manufacture of flat panel displays and liquid crystal displays (LCDs) can be aligned and positioned with greater accuracy. The rate of substrate breakage can be reduced by detecting when a substrate is misaligned and repositioning the substrate. The time during which substrates can be processed can be increased, and the throughput rate and processing yield similarly can be increased. In addition, the quality of the substrate process can be improved by reducing the number of times the system must be opened and exposed to atmospheric conditions.

Furthermore, the same image acquisition sensor that is used for detecting misalignment of substrates can be used for detecting a substrate identification inscribed on the substrate. Similarly, such an image acquisition sensor can be used to detect defects in the substrates so that the damaged substrates can be removed from further processing. Therefore, in various implementations, the image acquisition sensors can provide multiple advantages, thereby increasing efficiency and reducing the overall cost of substrate processing.

Other features and advantages will become apparent from the following description, drawings and claims.

DETAILED DESCRIPTION

Figure 1:
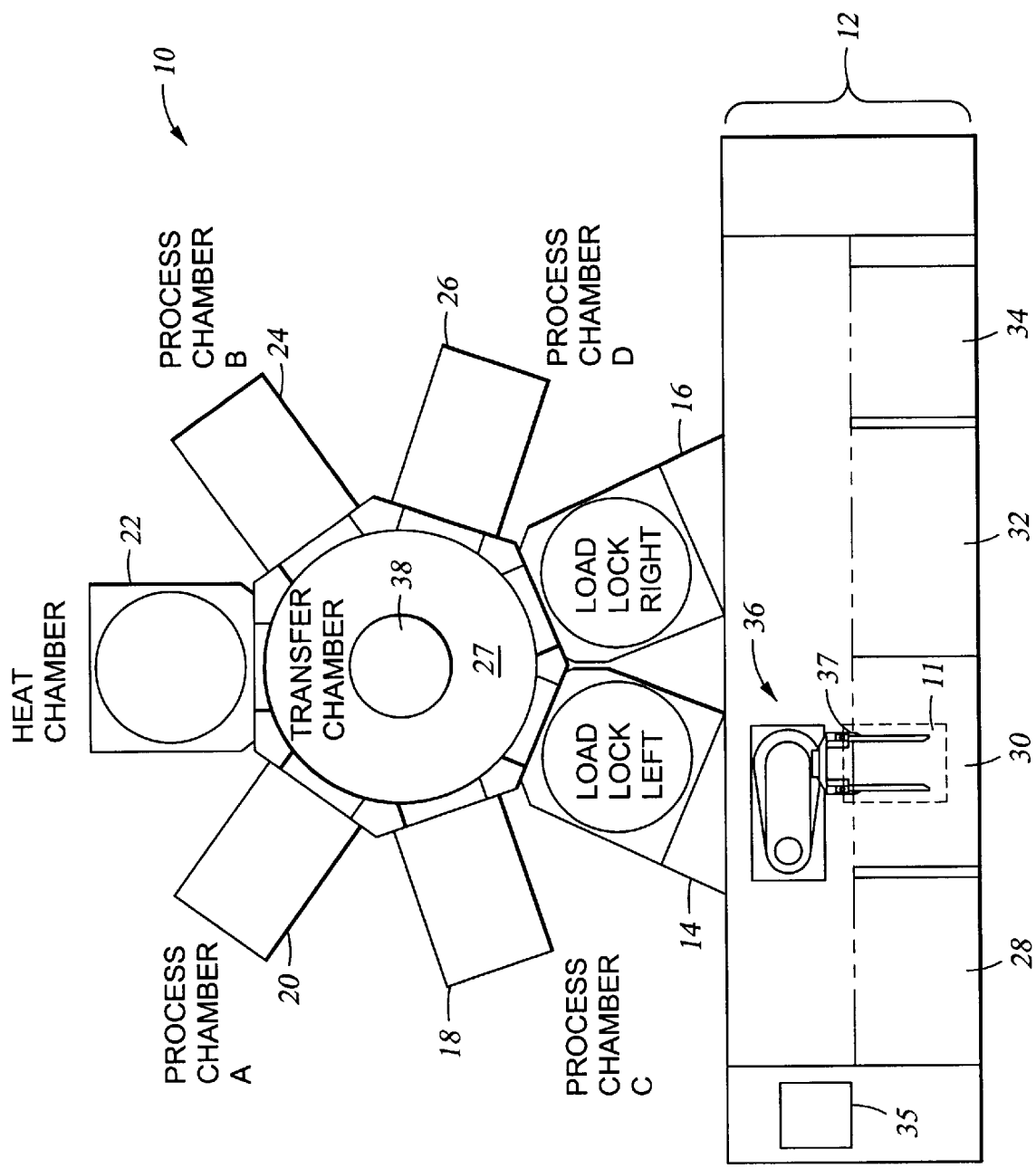
FIG. 1 is a diagrammatic top view of a substrate processing system according to the invention.

As shown in FIG. 1, a system 10 for processing a glass or similar substrate 11 includes an atmospheric cassette load station 12, two load lock chambers 14, 16, five substrate processing chambers 18–26 and a transfer chamber 27. The substrate processing chambers 18–26 can include, for example, a physical vapor deposition (PVD) chamber, a chemical vapor deposition (CVD) chamber, a pre-heat chamber, and an etch chamber.

Each load lock chamber 14, 16 includes two doors, one opening into the transfer chamber 27 and the other opening into to the atmosphere cassette load station 12. To load a substrate into the system, it is placed in one of the load lock chambers 14, 16 from the atmospheric side. Then the load lock chamber 14 (or 16) is evacuated, and the substrate is unloaded from the transfer chamber side.

The atmospheric cassette load station 12 includes an automatic atmospheric transfer arm or robot 36 and four cassettes 28–34 which contain processed and unprocessed substrates. The transfer chamber 27 includes an automatic vacuum transfer arm or robot 38 for transferring substrates into and out of load lock chambers 14, 16 and processing chambers 18–26. In operation, the atmospheric cassette load station 12 is at atmospheric pressure, and each of the processing chambers 18–26 and transfer chamber 27 is maintained at a sub-atmospheric pressure. The load lock chambers 14, 16 are at atmospheric pressure when a substrate is being transferred to or from atmospheric cassette load station 12, and they are at a sub-atmospheric pressure when a substrate is being transferred to or from the transfer chamber 27.

Figure 4:
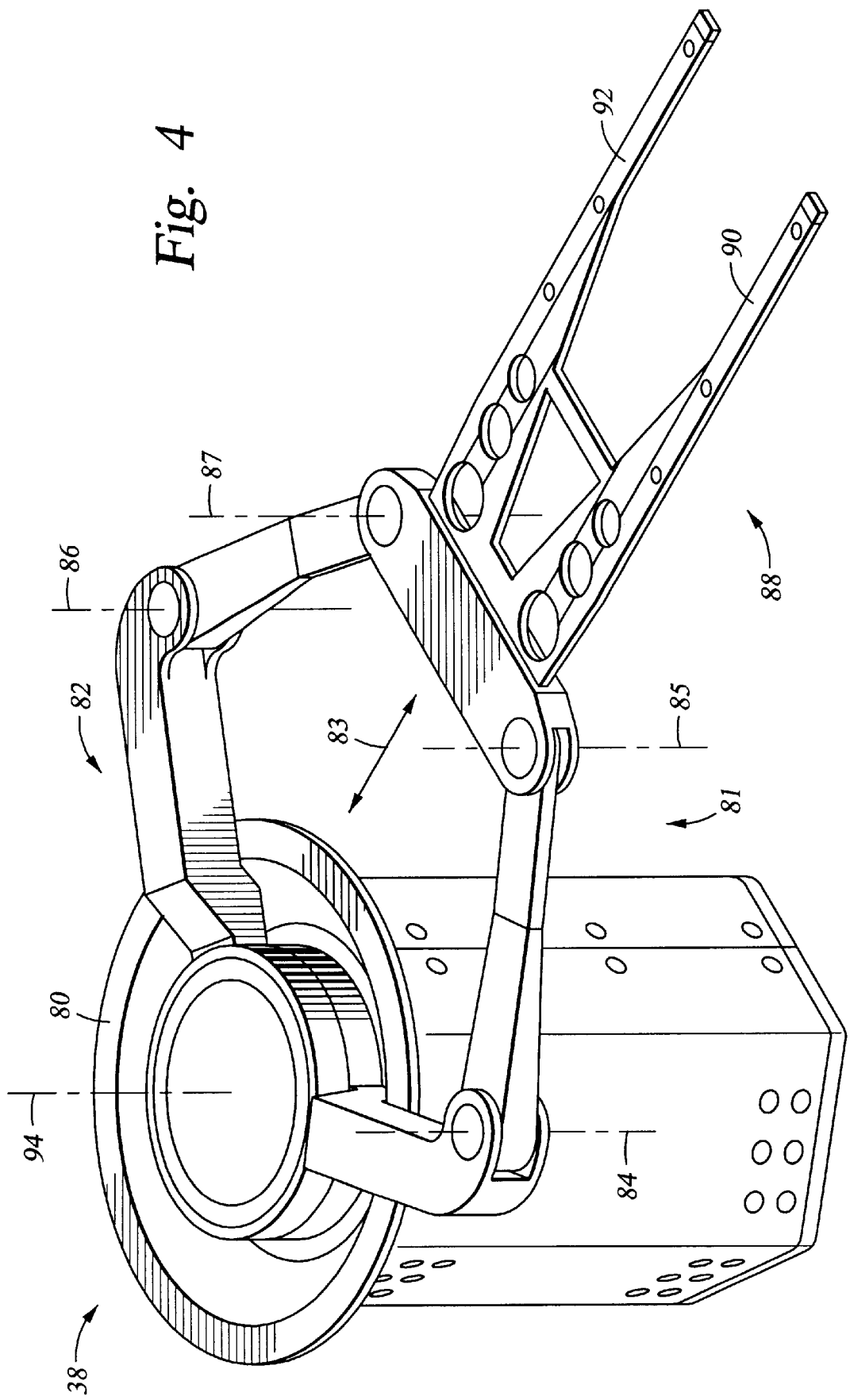
FIG. 4 is an elevated view of an automatic vacuum transfer arm.

Referring to FIG. 4, the vacuum transfer arm 38 has a base 80 that is sealed against the bottom of the transfer chamber 27 (FIG. 1) and includes a pair of arms 81, 82 which can extend and retract as indicated by the double-headed arrow 83 by pivoting about respective axes 84–87. The substrate 11 is supported on a support head 88 that includes two support blades 90, 92. The vacuum transfer arm 38 also can rotate about an axis 94.

Figure 5:
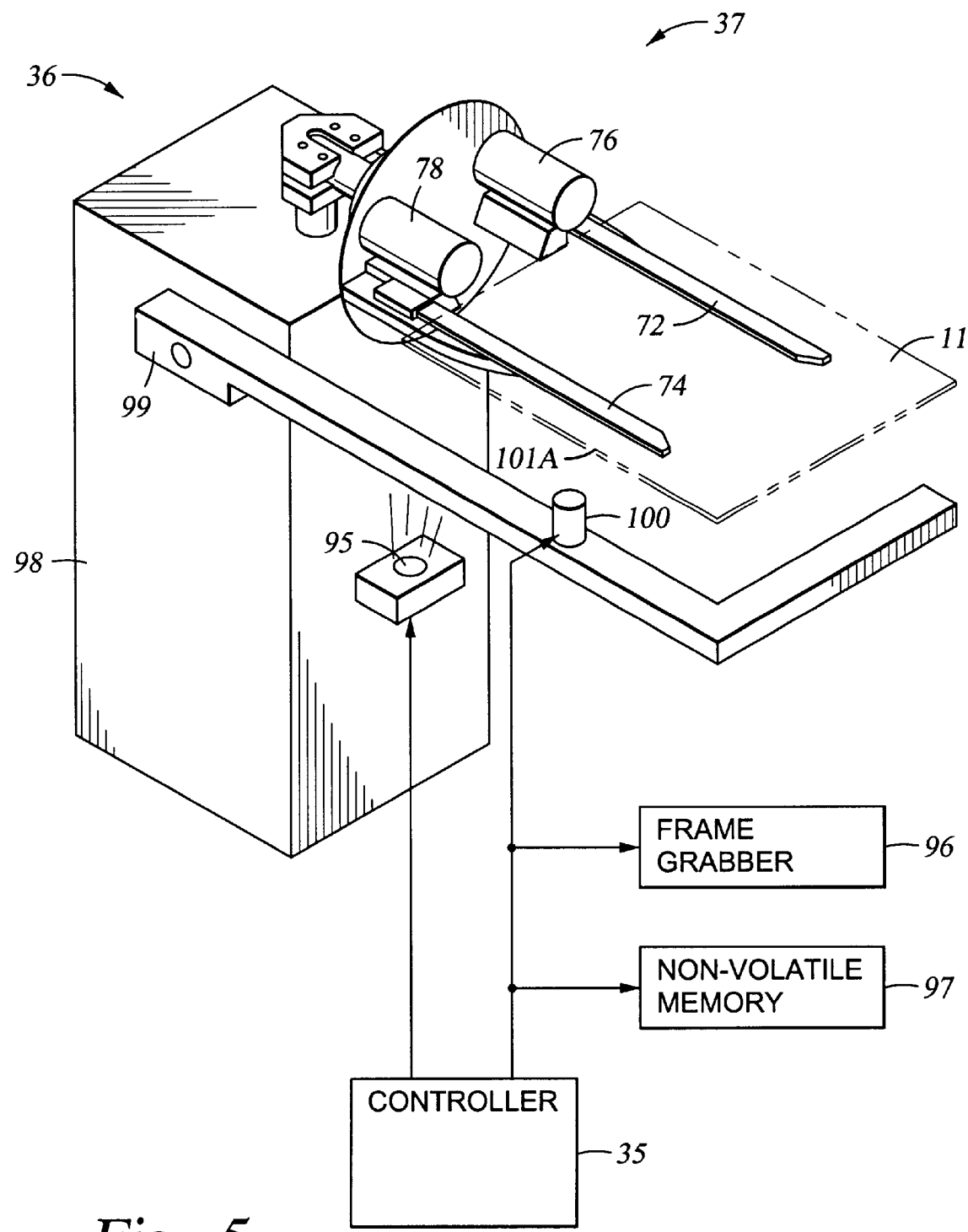
FIG. 5 is an elevated side view, not drawn to scale, of an automatic atmospheric transfer arm with an image acquisition system according to one implementation of the invention.
Figure 6:
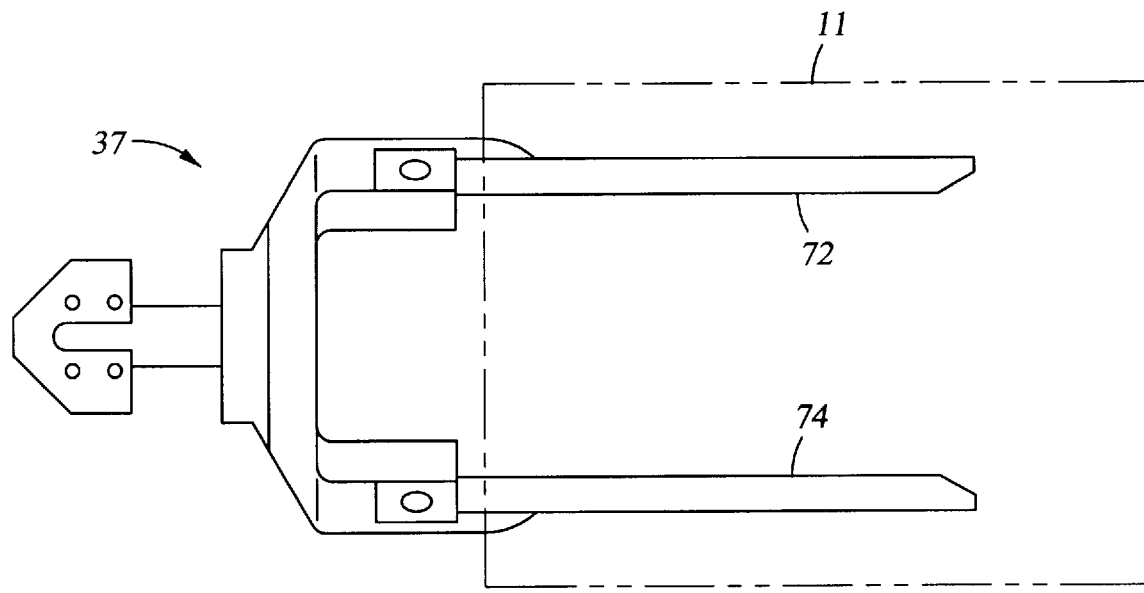
FIG. 6 is a top view of a transfer head of the atmospheric transfer arm.

Referring to FIGS. 5 and 6, the atmospheric transfer arm 36 includes a transfer head 37 with two thin support blades 72, 74 for supporting a substrate 11. The transfer head 37 has arm segments 76, 78 which can be rotated about multiple pivot axes to position the substrate 11, for example, in a load lock chamber with high accuracy. The transfer head 37 also can move up and down. Additionally, the atmospheric transfer arm 36 can slide back and forth along a linear track inside the atmospheric cassette load station 12

The positions and orientations of the atmospheric transfer arm 36, as well as the vacuum transfer arm 38, are controlled and recorded a microprocessor-based controller 35. For example, the transfer arms 36, 38 can be driven by servo motors whose positions are controlled by the controller 35.

Figure 2:
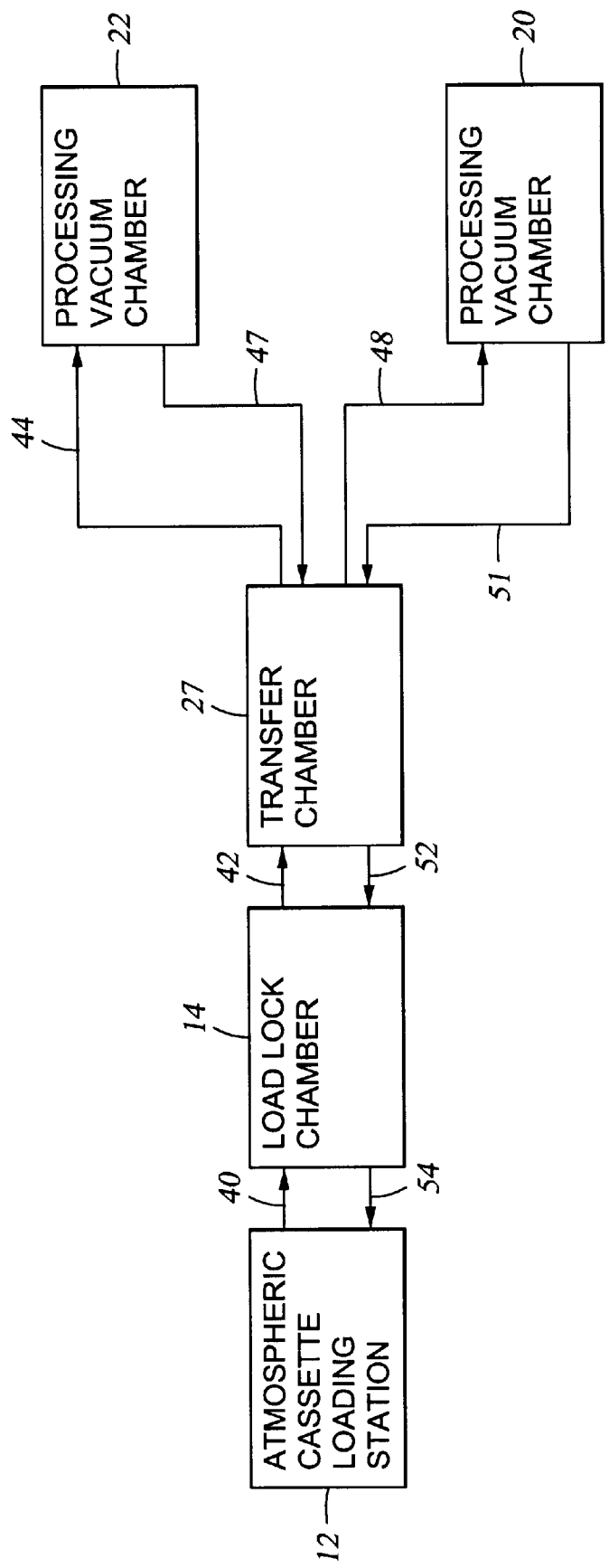
FIG. 2 is a block diagram illustrating an example of substrate movement through the substrate processing system.
Figure 3:
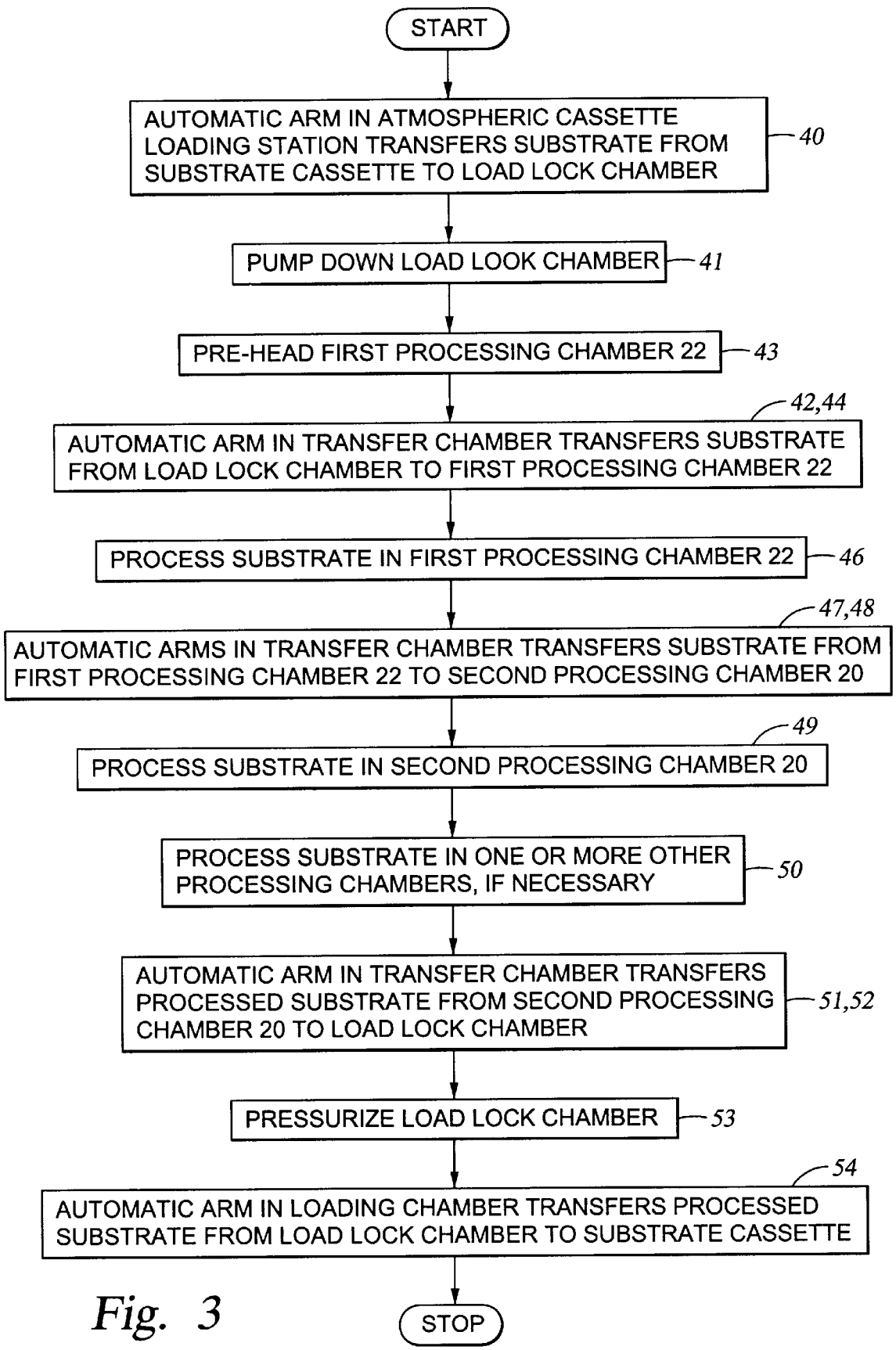
FIG. 3 is a flow chart of an exemplary method of processing a substrate in the substrate processing system.

Referring to FIGS. 2 and 3, in one implementation which can be used in a liquid crystal display (LCD) fabrication process, a glass substrate may be processed in system 10 as follows. The atmospheric transfer arm 36 transfers the substrate from the atmospheric cassette load station 12 to the load lock chamber 14 (step 40). The load lock chamber is pumped down to a pressure of about $10^{-5}$ Torr (step 41). A first processing chamber, such as the chamber 22, is preheated (step 43). The vacuum transfer arm 38 unloads the substrate from the load lock chamber 14 (step 42) and transfers the substrate to a pre-heat of first processing chamber 22 (step 44). The processing chamber 22 is pumped down to a pressure of about $10^{-8}$ Torr and the substrate is preheated to an initial temperature of about 200–400° C. (step 46). The vacuum transfer arm 38 unloads the substrate from the processing chamber 22 (step 47) and transfers the substrate to another processing chamber, such as the chamber 20, for further processing (step 48). The processing chamber 20 is pumped down to a pressure of about $10^{-8}$ Torr and the substrate is processed by depositing, such as by PVD or CVD, a layer of titanium, aluminum, chromium, tantalum, indium-tin-oxide (ITO), or the like, on the substrate (step 49). The substrate may be processed in one or more other processing chambers, if necessary (step 50). After the substrate is finally processed, the vacuum transfer arm 38 unloads the substrate from the final processing chamber (step 51) and transfers the substrate to the load lock chamber 14 (step 52). The load lock chamber 14 is pressurized back to atmospheric pressure (step 53). The atmospheric transfer arm 36 then transfers the substrate from the load lock chamber 14 to a cassette in the atmospheric cassette load station 12 (step 54).

To help prevent significant substrate misalignment, the processing system 10 includes one or more image acquisition sensors, positioned to provide information relating to the orientation and position of a substrate 11, as described in greater detail below. The acquired information can be used by the controller 35 to adjust the position and/or orientation of the substrate 11.

Referring again to FIG. 5, an image acquisition sensor, such as a camera 100, is positioned in a fixed location with respect to the base 98 of the atmospheric transfer arm 36. The camera 100 can be mounted, for example, on a metal bracket or flange 99 attached to the base 98 of the transfer arm 36. In the illustrated implementation, the camera 100 is positioned slightly below the support blades 72, 74. The camera 100 is coupled to the controller 35 which controls the operation of the camera. Signals corresponding to images acquired or captured by the camera 100 can be sent to the controller 35 for processing, as explained below.

Figure 7:
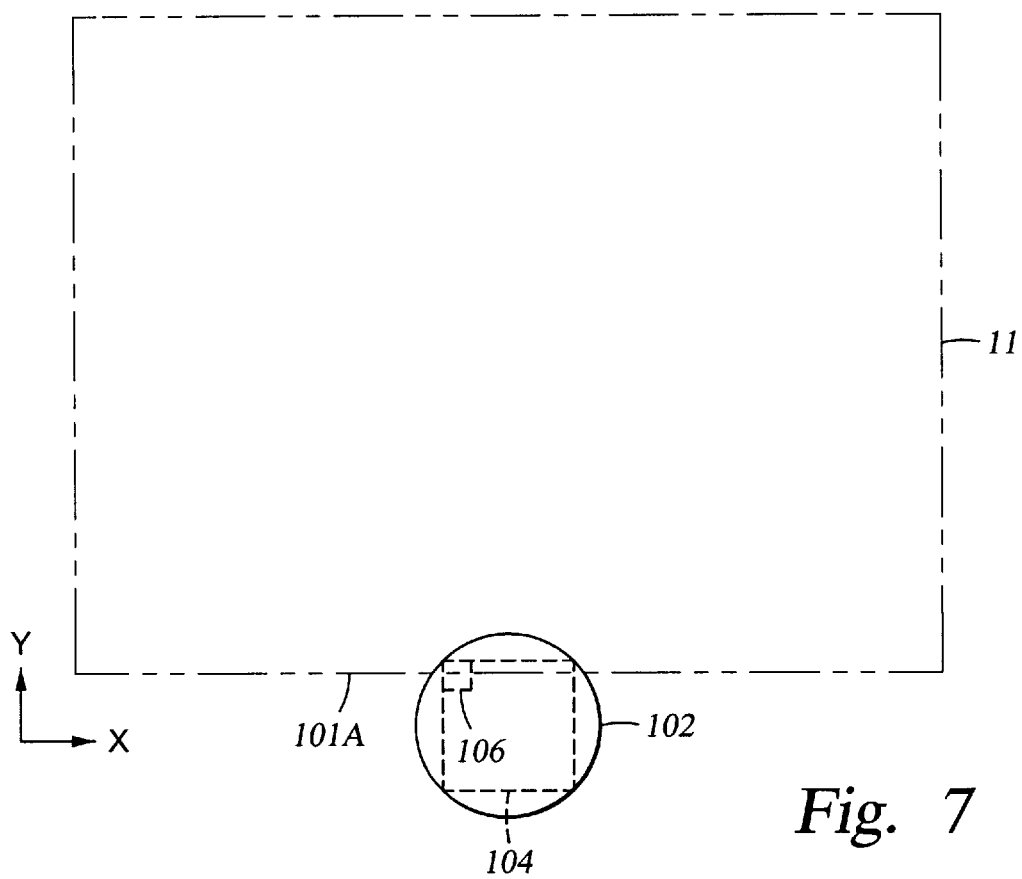
FIG. 7 shows further details of the implementation of FIG. 5.

Referring to FIG. 7, in one implementation, the camera 100 includes a lens having a focal plane 102 and an array of charge coupled devices (CCDs) 104 forming an NxM array of pixels 106. A typical substrate 11 is on the order of one square meter. Substrates having other dimensions, however, also can be used. The edges of the substrate 11, such as the edge 101A, can be substantially straight, beveled or rounded. In one implementation, the camera 100 is approximately 100–200 millimeters (mm) from the bottom surface of the substrate 11. In other implementations, the camera 100 can be positioned closer to or further from the substrate 11. The shape and size of the camera lens and the size of the CCD array 104 are selected to provide a post-processing resolution of at least approximately one mm per meter, in other words, a resolution of at least about 1/1000th.

Figure 8:
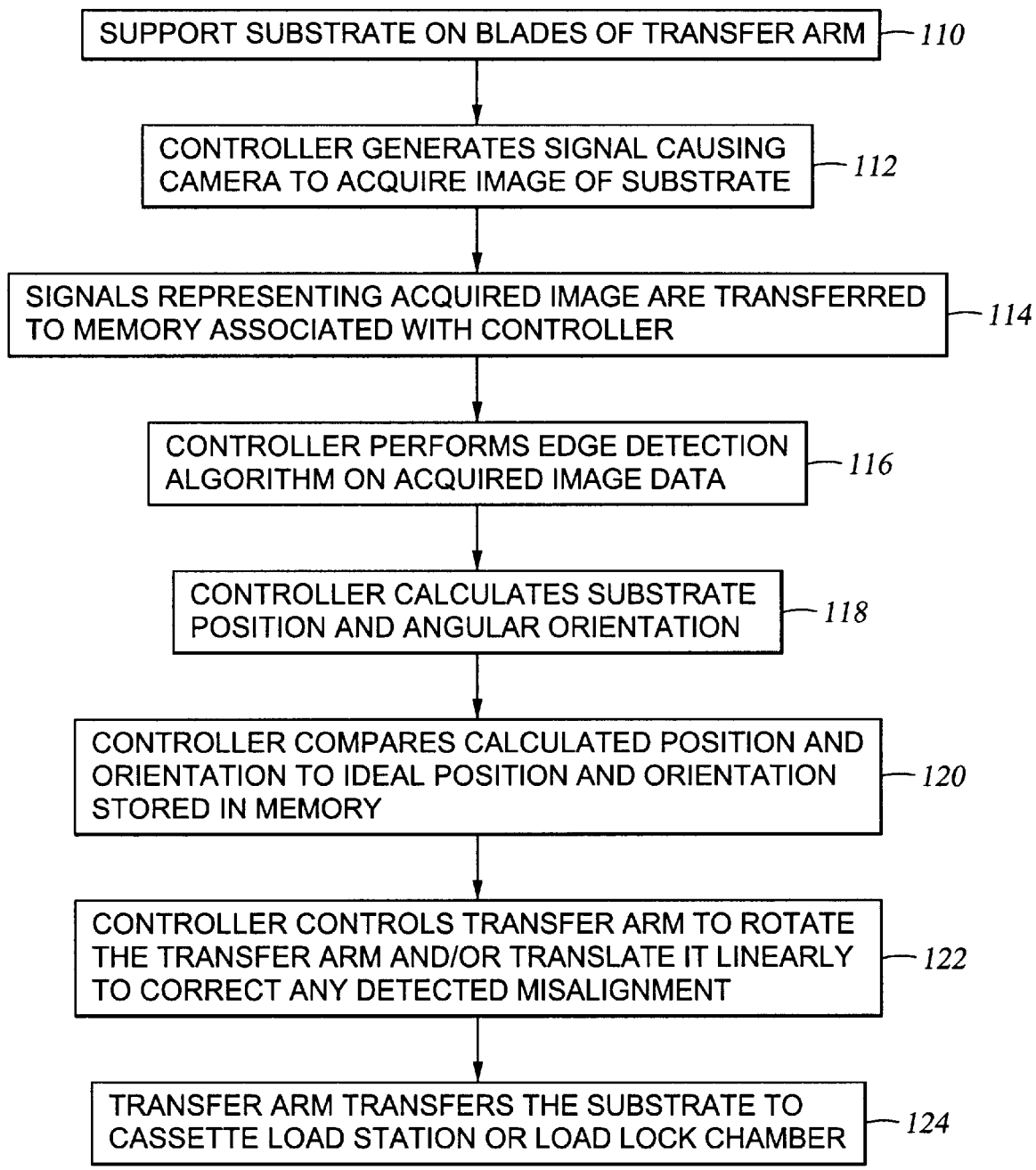
FIG. 8 is a flow chart of a method according to one implementation of the invention.

Referring to FIG. 8, the atmospheric transfer arm 36 supports the substrate 11 for transfer between the atmospheric cassette load station 12 and, for example, the load lock chamber 14 (step 110). When the substrate 11 is supported by the blades 72, 74 and the transfer head 37 is controlled by the controller 35 to position the blades 72, 74 in a predetermined position, a portion of a side edge 101A of the substrate 11 is within the camera's view. As indicated by step 112, the controller 35 generates a signal causing the camera 100 to capture or acquire the image in the CCD array 104. Signals representing the captured image from the CCD array 104 are transferred to a frame grabber or memory array 96 associated with the controller 35 (step 114). The controller 35 then performs any one of several edge detection algorithms on the captured image data (step 116). The edge detection algorithm can include an edge enhancement feature. Pixels 106 receiving light reflected by or transmitted through the edge 101A will store different signal levels compared to pixels receiving light reflected by or transmitted through the body of the substrate or transmitted through the air. The controller 35 calculates the angular orientation of the substrate 11 in the X-Y plane (FIG. 7) and the position of the substrate along the Y-axis based on detection of the substrate edge (step 118). The calculated values are compared to an ideal substrate orientation and ideal position stored in a non-volatile memory 97 associated with the controller 35 (step 120). Based on the comparison, the controller 35 can control the transfer arm 36 to rotate the substrate 11 and/or translate it linearly along the Y-axis to correct any detected misalignment of the substrate 11 (step 122). The transfer arm 36 then can transfer the substrate 11 to the cassette load station 12 or the selected load lock chamber, as appropriate (step 124).

Figure 9:
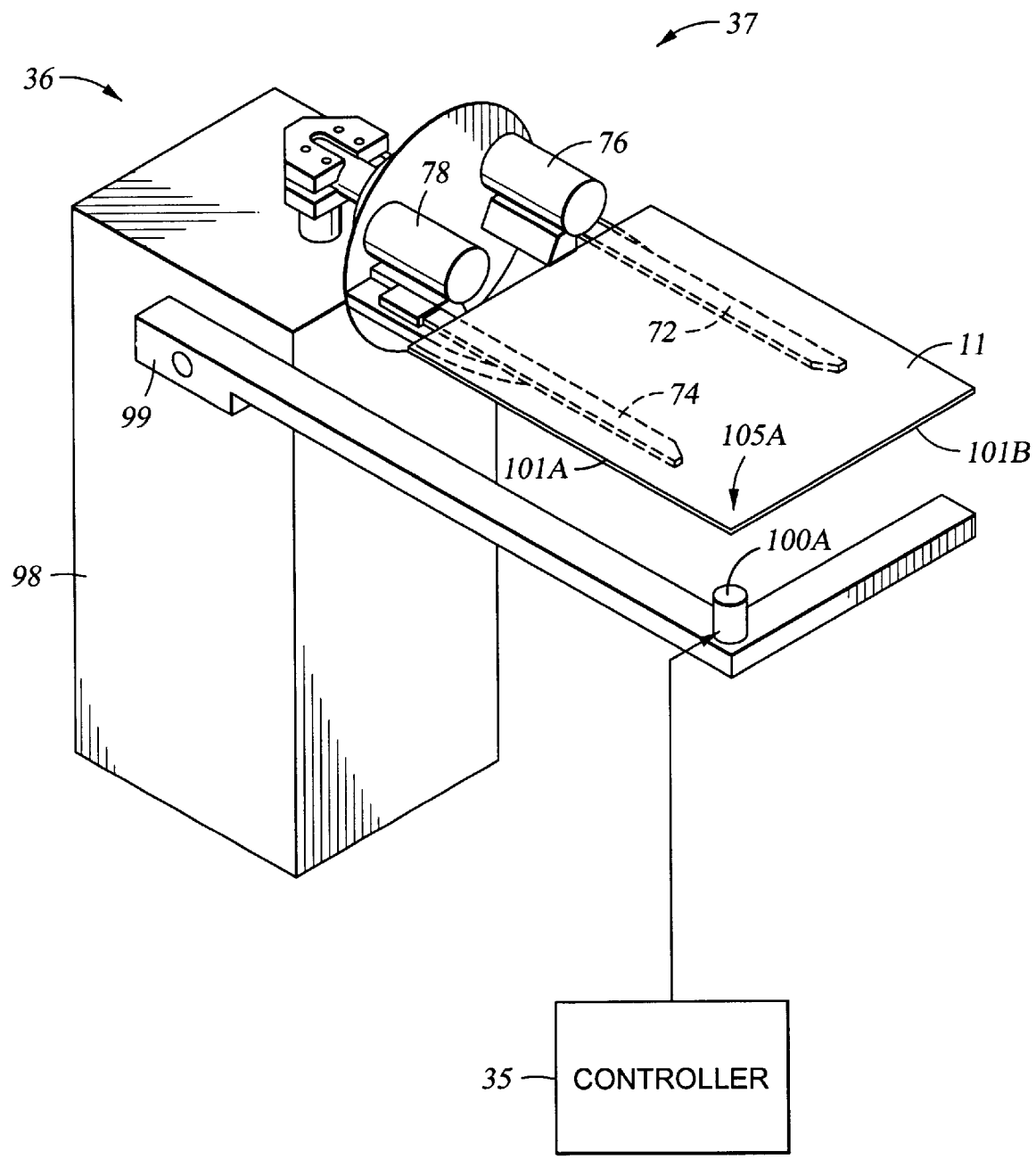
FIG. 9 is an elevated side view of a transfer arm with an image acquisition system according to a second implementation of the invention.
Figure 10:
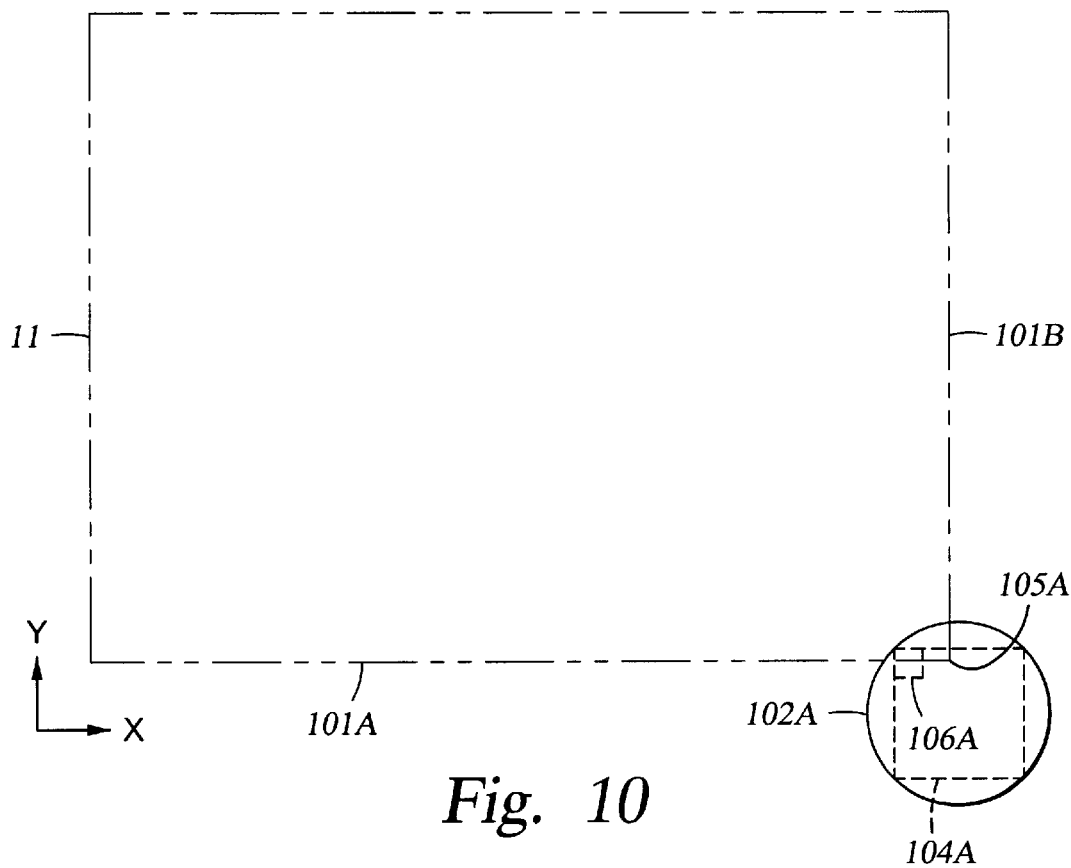
FIG. 10 shows further details of the implementation of FIG. 9.

FIGS. 9–10 illustrate another implementation in which a single camera 100A is positioned so that when the substrate 11 is supported by the blades 72, 74 and the blades are in a predetermined position, a portion of the corner 105A of the substrate 11 is within the camera's view 102A. Thus, a single camera 100A can capture a portion of at least two adjacent edges of the substrate 11, and misalignment of the substrate 11 along both the X-axis and the Y-axis can be detected. The controller 35 uses an edge detection algorithm to analyze the captured image and determine the orthoganol lines representing the adjacent edges 101A, 101B which form the corner 105A. The controller 35 then uses a corner detection algorithm in which, for example, it calculates the point of intersection of the lines corresponding to the edges 101A, 101B. The point of intersection corresponds to the location of the substrate corner 105A. The memory 97 also stores information indicative of the nominal size of the substrate 11. Based on the nominal size of the substrate 11 and the calculated point of intersection, the center point of the substrate in the X-Y plane can be calculated. Additionally, the lines corresponding to the edges 101A, 101B can be used to calculate the angular orientation of the substrate 11. The calculated values for the center of the substrate and its angular orientation are compared to ideal values stored in the memory 97. Based on the comparison, the substrate 11 can be rotated or moved along the X-axis, the Y-axis, or both to adjust the position of the substrate 11 and bring it closer to an ideal position. The angular orientation of the substrate 11 also can be adjusted based on the results of the comparison.

Positioning a camera to capture an image of the substrate corner 105A is advantageous because it allows the angular orientation of the substrate 11, as well as its position in the X-Y plane, to be determined. However, in some situations, a camera positioned as illustrated in FIGS. 9–10 may not capture as much useful information as desired. For example, depending on the initial position of the substrate 11 with respect to the camera 100A, only a relatively small percentage of pixels 106A of the CCD array 104A may detect light signals reflected by or transmitted through the edge 101A.

Figure 12:
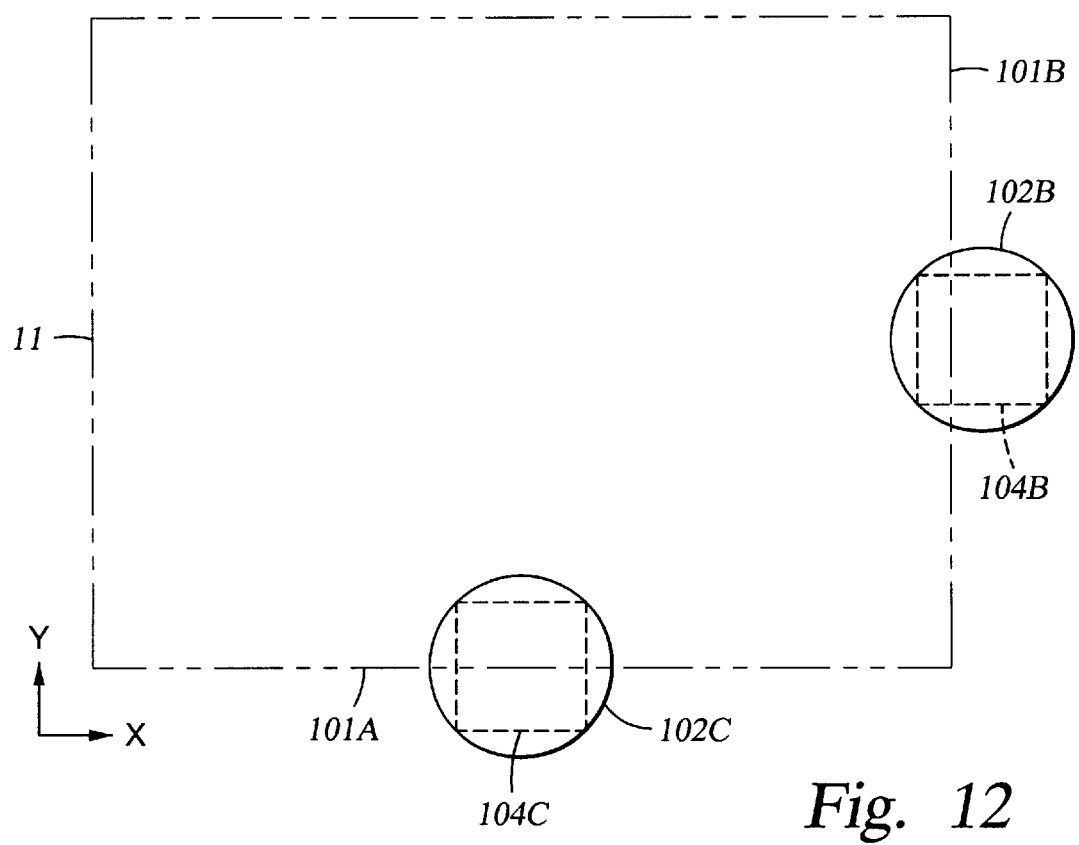
FIG. 12 shows further details of the implementation of FIG. 11.
Figure 11:
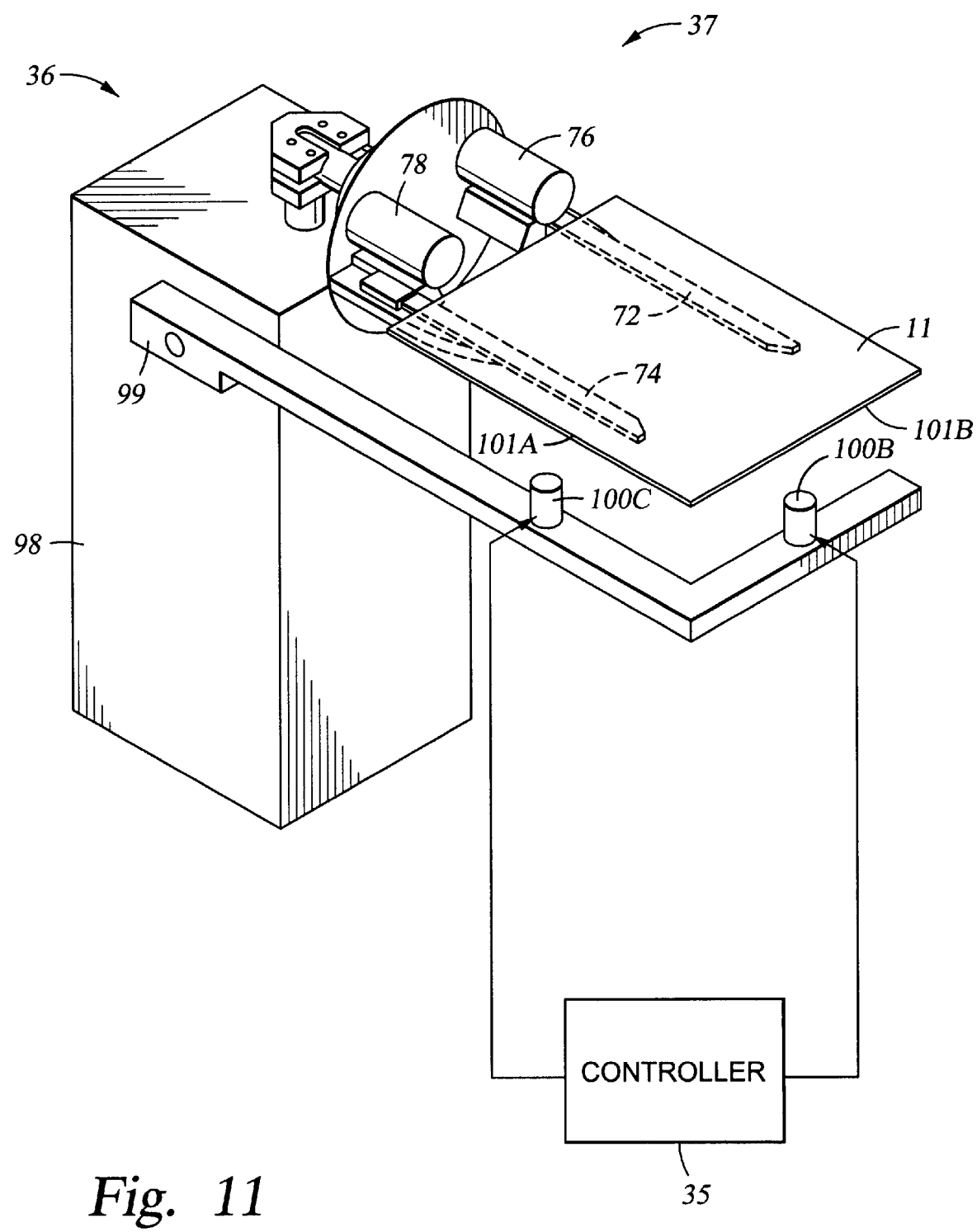
FIG. 11 is an elevated side view of a transfer arm with an image acquisition system according to a third implementation of the invention.

A third implementation, incorporating multiple cameras 100B, 100C, is illustrated in FIGS. 11–12. The cameras 100B, 100C are positioned so that when the substrate 11 is supported by the blades 72, 74 and the blades are in a predetermined position, adjacent sides 101A, 101B of the substrate 11 are within the view of the respective cameras 100B, 100C. Using images from two or more cameras allows the controller 35 to obtain better resolution and to determine the angular orientation and position of the substrate 11 in the X-Y plane more accurately. The controller 35 then can correct any detected misalignment of the substrate 11 with more precision. In one implementation, the time allotted for the measurement of the substrate position and orientation is in the range of a fraction of a second.

In some situations, the substrate 11 vibrates slightly while resting on the blades 72, 74. Such vibrations, on the order of several millimeters or less, can occur even when movement of the transfer arm 36 is stopped momentarily to permit the alignment measurements to be made. The vibrations can result in slightly blurred images captured by the cameras as the substrate 11 goes in and out of focus. Moreover, the pixel(s) 106 which capture the image of a particular spot on the substrate 11 can vary depending on the vibrations of the substrate. The vibrations, therefore, can adversely affect the system's calculation of the substrate misalignment and can cause the controller 35 to overcompensate or undercompensate for a perceived misalignment.

To compensate for substrate vibrations more accurately, the cameras, such as the camera 100, can include an automatic focus feature. Alternatively, to further reduce the cost, the controller 35 can control each camera, such as the camera 100, to capture multiple images within a small time frame. In one implementation, for example, the cameras are controlled to capture multiple images at the rate of approximately 60 Hertz (Hz). The controller 35 then determines an average signal for each pixel 106 based on the captured images. The average signals then can be used to calculate a nominal, or static, substrate position and orientation. In addition, the camera lens can have a depth of focus designed to cover the expected amplitude of substrate vibration.

To increase the resolution of the captured images even further, the controller 35 can be programmed to use any one of several sub-pixel processing techniques. In one implementation, for example, sub-pixel processing provides one-tenth pixel resolution.

In some situations, ambient light is sufficient to allow the controller 35 to detect the contrast in the pixels of the captured images so that the position of the edges, such as the edge 101A, can be determined. In other situations, however, one or more light sources 95 (FIG. 5) can be provided to enhance the contrast and improve the results of the edge detection algorithm. In one implementation, for example, an incandescent light source is provided on the same side of the substrate 11 as the camera 100. In another implementation, a strobe lamp is used as the light source 95. The strobe lamp can be used to freeze the image acquired by the camera 100. Such a feature can be particularly useful if the frequency of substrate vibration is relatively high.

Figure 13:
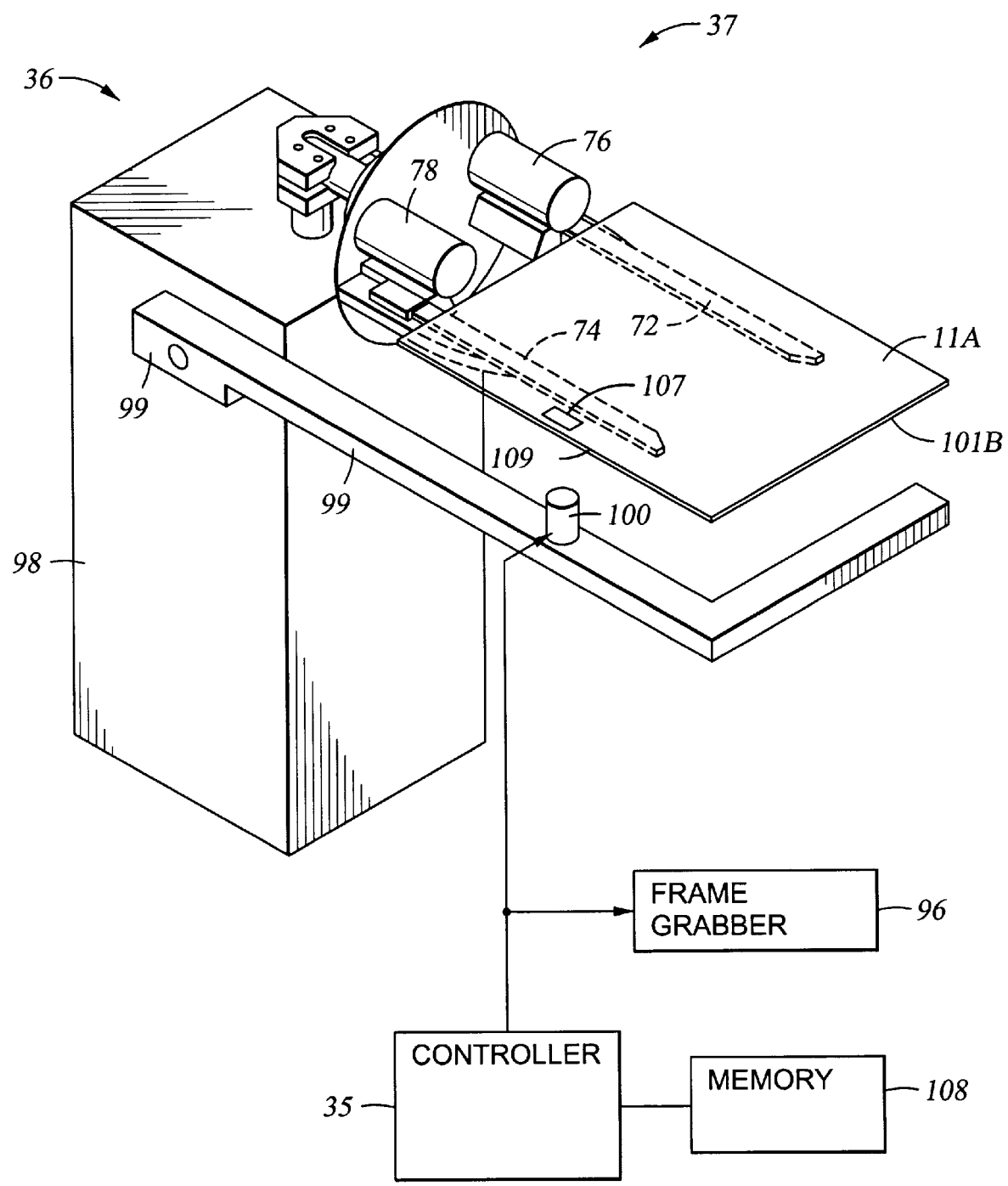
FIG. 13 is an elevated side view of a transfer arm illustrating additional features of an image acquisition system according to an implementation of the invention.

The cameras, such as the camera 100, can be used for other or additional purposes as well. Referring to FIG. 13, a glass substrate 11A includes a substrate identification 107 along a surface adjacent one of its side edges 109. The substrate identification 107 can be etched, engraved or otherwise inscribed on the substrate 11A. In one implementation, the substrate identification 107 includes alpha-numeric symbols. The camera 100 is positioned so that when the substrate 11A is supported by the blades 72, 74 and the transfer head 37 is controlled by the controller 35 to position the blades 72, 74 in a predetermined position, the surface of the substrate 11A containing the substrate identification 107 is within the view of the camera 100. One or more images can be acquired by the camera 100 and transferred to the frame grabber 96 for processing by the controller 35 as described above. When the images are processed by the controller 35, a character recognition algorithm is used to interpret the acquired image of the substrate identification 107. In another implementation, the substrate identification 107 includes a bar code, and the controller 35 uses a bar code reader algorithm to process the acquired images. The substrate identification 107 as determined by the controller 35 can be stored in a memory 108 for subsequent retrieval.

Figure 14A:
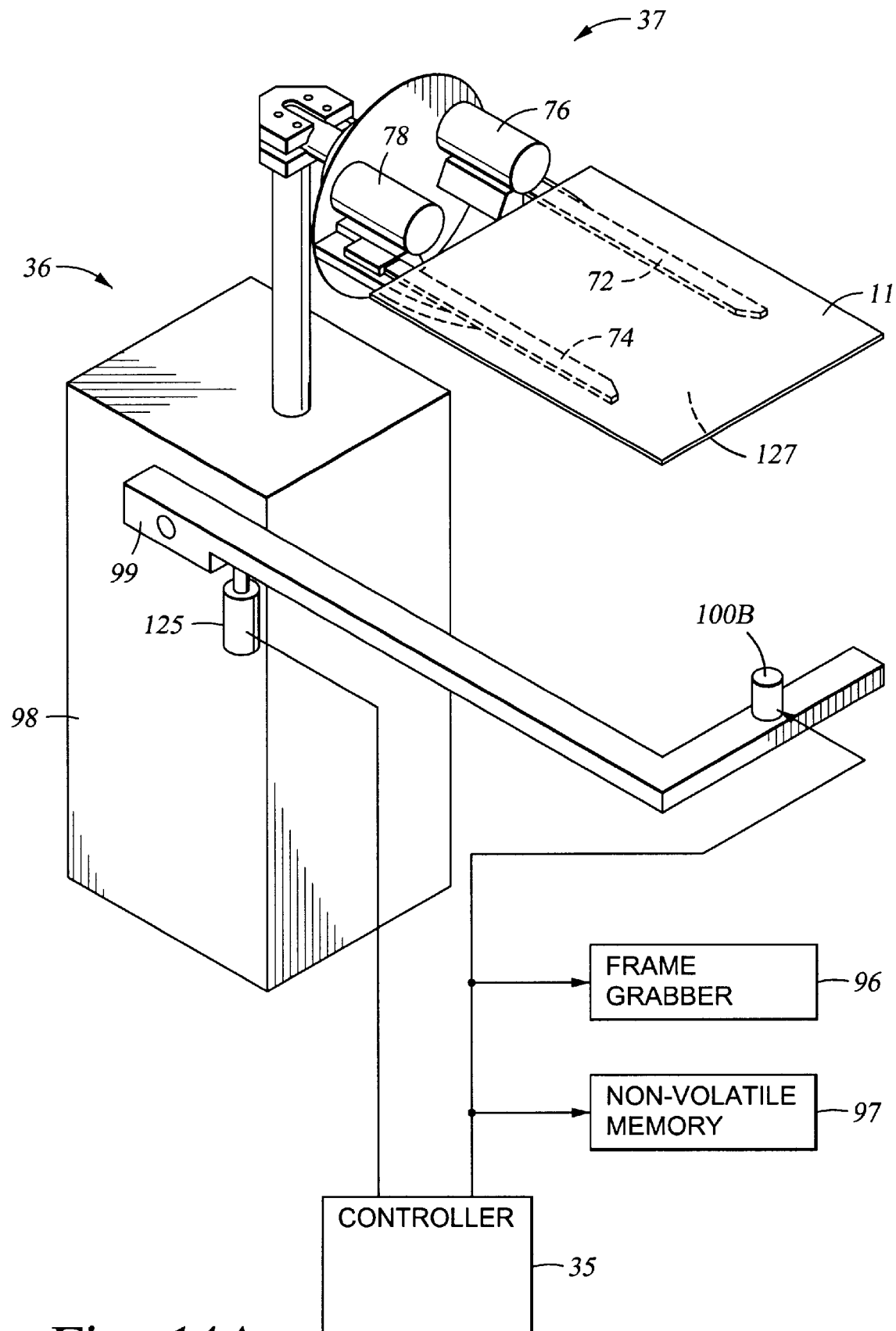
FIGS. 14A and 14B are elevated side views of a transfer arm illustrating yet further features of an image acquisition system according to an implementation of the invention.
Figure 14B:
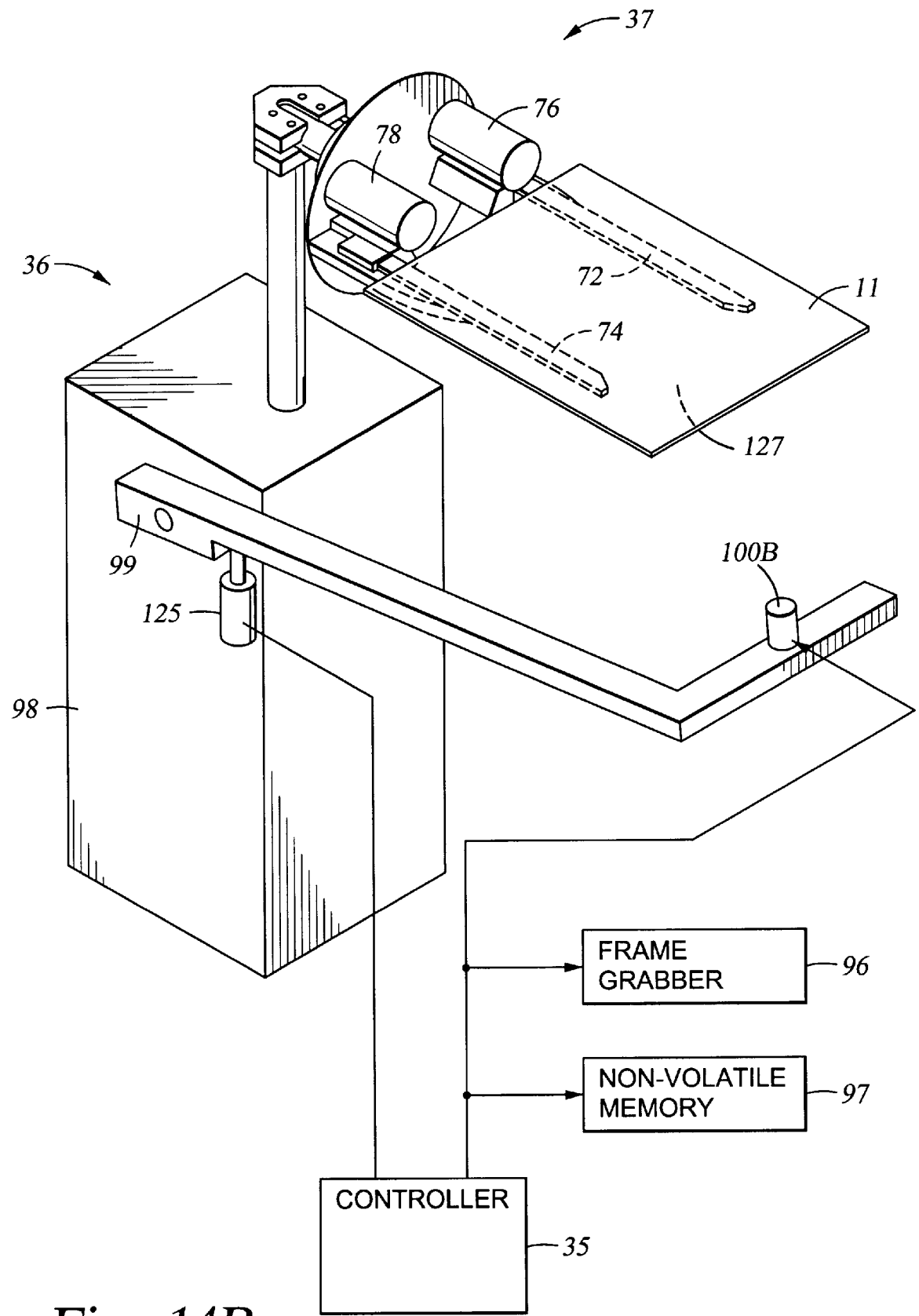

The image acquisition sensors, such as the camera 100B, also can be used for the detection of gross substrate defects either prior to or after processing a substrate in the chambers 18–26. Referring to FIG. 14A, the transfer arm 36 is shown with the transfer head 37 raised to an elevated position while the blades 72, 74 support the substrate 11. The bracket 99 on which the camera 100B is mounted can be rotated between first and second positions, shown, respectively, in FIGS. 14A and 14B. When the camera 100B is used to acquire images to permit the controller 35 to correct substrate misalignment, then the bracket 99 is its first position. The controller 35 can control a pneumatic actuator 125 to rotate the bracket 99 from its first position to its second position. When the bracket 99 is rotated to its second position (FIG. 14B), the camera 100B is tilted slightly so that it can acquire an image that includes substantially an entire surface 127 of the substrate 11. The controller 35 causes the camera 100B to acquire one or more images of substantially the entire substrate surface 127. The acquired images are transferred to the frame grabber 96 so that the controller 35 can process the acquired images. In one implementation, an ideal image of a substrate is stored in the memory 97, and the acquired images are compared to the ideal image. For example, in one implementation, the intensity of each pixel in the acquired images can be compared to the intensity of a corresponding pixel in the stored ideal image. If the differences between the pixel intensities of the acquired images are not within predetermined tolerances when compared to the pixel intensities of the ideal image, then the substrate 11 is assumed to contain a gross or substantial defect. Such defects can include, for example, chipped edges or cracks in the substrate. Further processing of the substrate 11 then can be halted and the substrate can be removed from the system 10.

The cameras or other image acquisition sensors can be positioned to capture images of the substrate 11 other than along the edges 101A, 101B or other than at the corner 105A. Thus, for example, one or more image acquisition sensors can be supported by flanges or brackets such that the image acquisition sensors are positioned adjacent the base of the transfer arm 36. Also, the relative size of the brackets or other supports for the image acquisition sensors can be smaller than they appear in the accompanying drawings.

Figure 15:
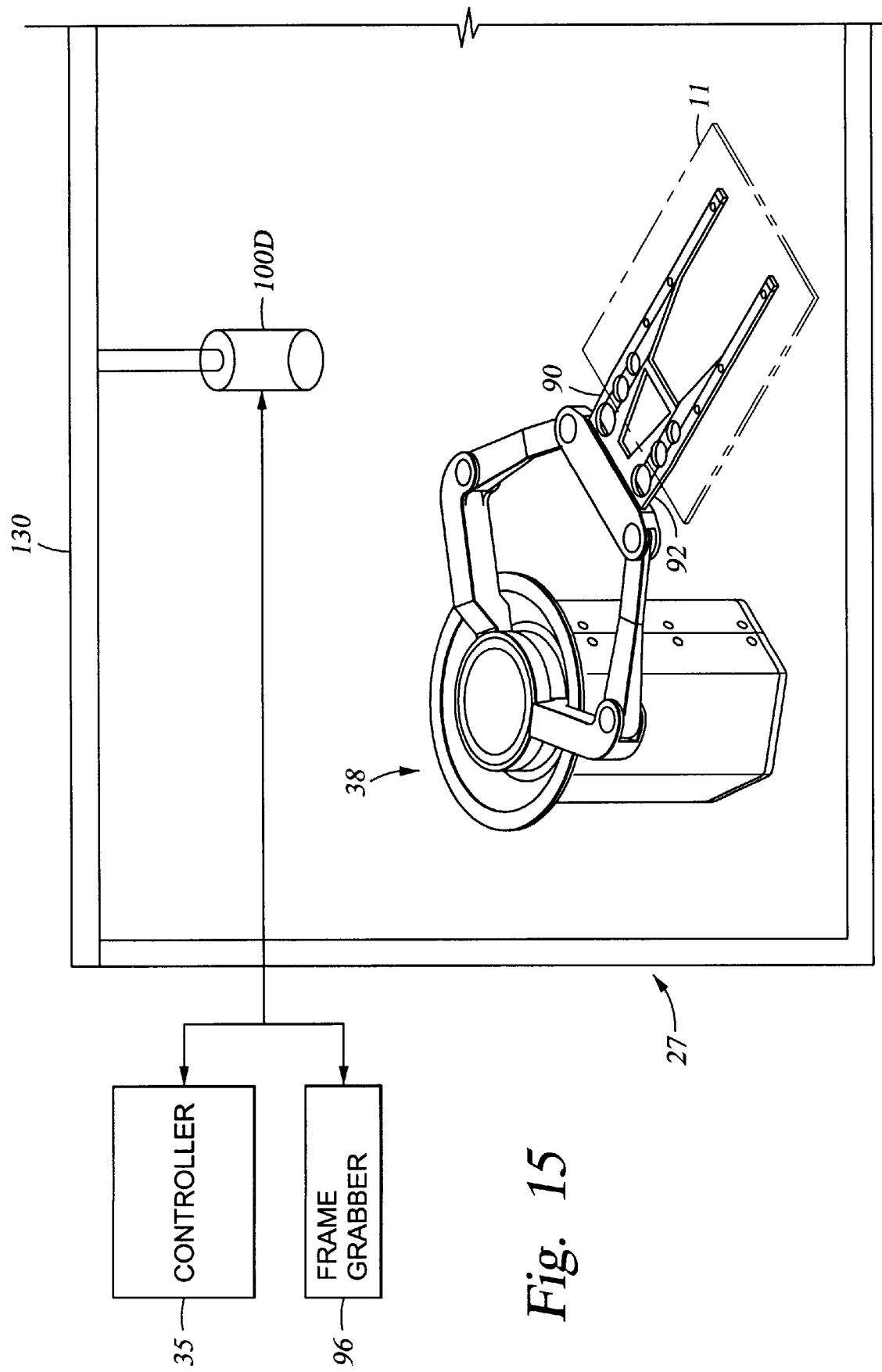
FIG. 15 is an elevated view of the vacuum transfer arm with an image acquisition system according to one implementation of the invention.

Although the foregoing implementations have been described in the context of the atmospheric transfer arm 36, image acquisition sensors, such as a camera 100D (see FIG. 15), can be used with other substrate handling devices as well, such as the vacuum transfer arm 38, to perform one or more of the following functions: correct substrate misalignment, determine substrate identification, and perform pre-processing or post-processing defect detection. The image acquisition sensors need not be attached or mounted directly on the transfer arms 36, 38. Thus, for example, the camera 100D can be mounted on the lid 130 of the transfer chamber 27 to allow images to be acquired of a substrate 11 supported by the blades 90, 92 of the vacuum transfer arm 38. The location of such cameras with respect to some fixed reference point, however, must be known or provided to the controller 35.

In general, images of a substrate can be captured and the position of the substrate can be adjusted when the substrate is transferred from one location to another, including to or from a load lock chamber, a processing chamber, or a cassette load station.

Figure 16:
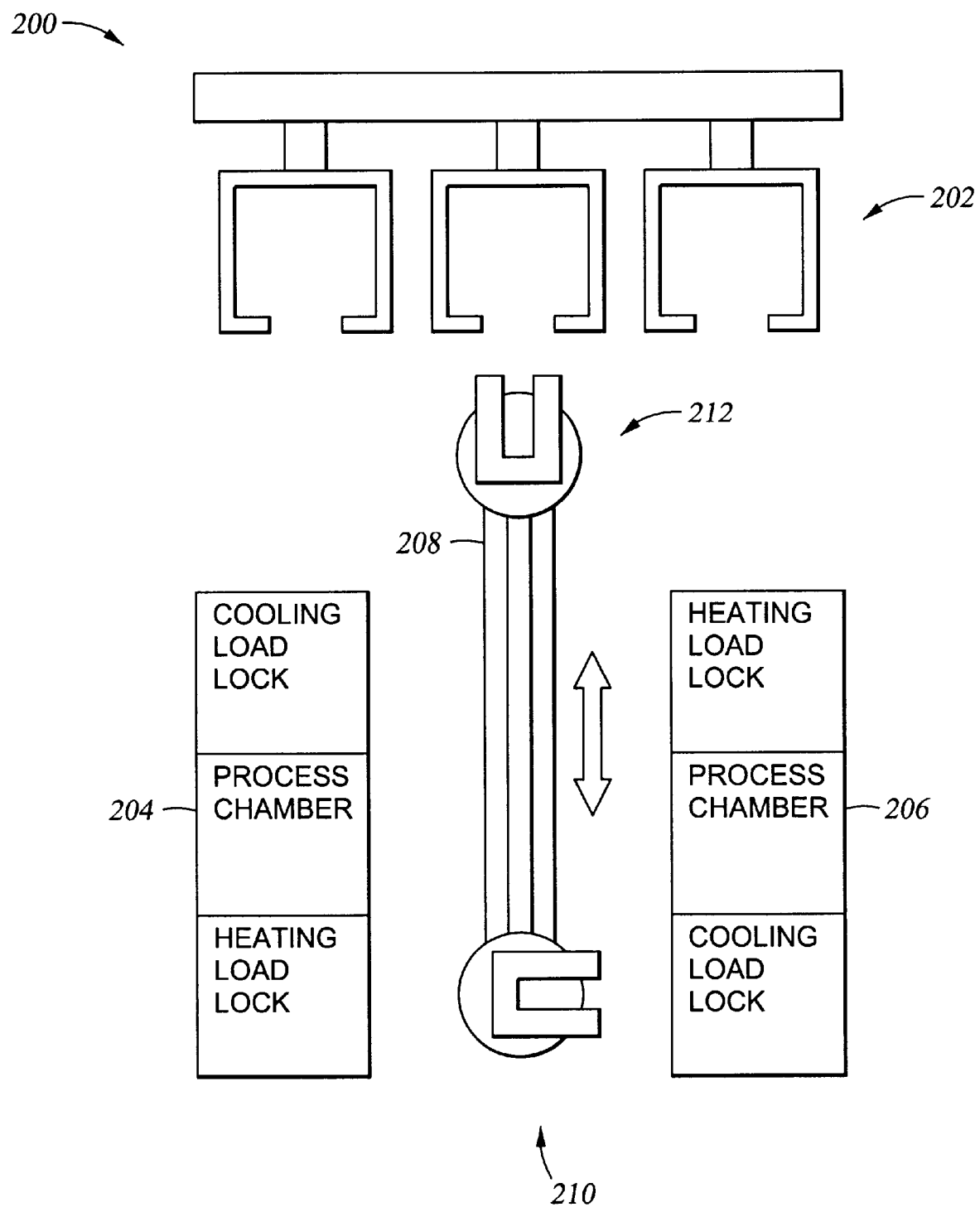
FIG. 16 is a diagrammatic top view of another substrate processing system in which image acquisition sensors can be used according to the invention.

Similarly, image acquisition sensors can be incorporated into substrate processing systems different from the particular system described above to adjust substrate alignment or to perform pre-processing or post-processing defect detection. Thus, one or more image acquisition sensors can be incorporated into the system described in U.S. patent application Ser. No. 08/946,922 now abandoned. As shown, for example, in FIG. 16, a substrate processing system has an aisle 210 which includes a conveyor system 202 and islands 204, 206 of chambers. A robot 212, which can move along a track 208, can transfer substrates to or from the conveyor 202 as well as the islands 204, 206. Image acquisition sensors can be mounted to the robot 212, for example, to correct substrate misalignment, to determine substrate identification, and to perform pre-processing or post-processing defect detection. Such linear systems are particularly suited for the processing of large substrates.

Other implementations are within the scope of the claims.

What is claimed is:

1. A method of positioning a substrate, comprising:
supporting the substrate on a substrate support of a substrate handling apparatus comprising a base and a transfer arm connected to the base;
acquiring at least one image of the substrate supported on the substrate support using at least one image acquisition sensor connected to the base;
determining an initial position of the substrate based on the at least one acquired image; and
moving the substrate support based on the initial position to adjust for a misalignment of the substrate.

2. The method of claim 1 further comprising transferring the substrate to a processing chamber after moving the substrate support to adjust for the misalignment.

3. The method of claim 1 further comprising transferring the substrate to a load lock chamber after moving the substrate support to adjust for the misalignment.

4. The method of claim 1 further comprising moving the substrate support to adjust for the misalignment after removing the substrate from a processing chamber.

5. The method of claim 1 further comprising moving the substrate support to adjust for the misalignment after removing the substrate from a load lock chamber.

6. The method of claim 5 wherein acquiring at least one image comprises capturing an image with an array of charge-coupled devices.

7. The method of claim 5 further comprising comparing the determined initial position to an ideal position, wherein moving the substrate support comprises translating the substrate support linearly.

8. The method of claim 5 further comprising comparing the determined initial position to an ideal position, wherein moving the substrate support comprises rotating the substrate support.

9. The method of claim 5 wherein one of the acquired images includes a substrate identification, the method further comprising performing a character recognition algorithm to interpret the substrate indentification.

10. The method of claim 5 further comprising:
translating the substrate support vertically while the substrate is supported thereon;
acquiring an image that includes substantially an entire surface of the substrate; and
determining whether defects exist in the substrate based on the image of substantially the entire substrate surface.

11. The method of claim 1 comprising determining an initial angular orientation of the substrate based on the at least one acquired image.

12. The method of claim 11 further comprising comparing the initial position and initial angular orientation to an ideal position and an ideal angular orientation.

13. The method of claim 11 comprising rotating the substrate support based on the initial position to adjust for an angular misalignment of the substrate.

14. The method of claim 1 wherein acquiring at least one image comprises acquiring at least one image of at least one edge of the substrate and wherein determining an initial position of the substrate comprises using an edge detection algorithm.

15. The method of claim 14 comprising acquiring at least one image from each of a plurality of image acquisition sensors.

16. The method of claim 14 comprising acquiring a plurality of images from each of the at least one image acquisition sensors.

17. The method of claim 1 wherein acquiring at least one image comprises acquiring at least one image of a corner of the substrate.

* * * * *

UNITED STATES PATENT AND TRADEMARK OFFICE
CERTIFICATE OF CORRECTION

PATENT NO.     : 6,215,897 B1
DATED          : April 10, 2001
INVENTOR(S)    : Beer et al.

It is certified that error appears in the above-identified patent and that said Letters Patent is hereby corrected as shown below:

Title page,
Item [54], please insert "AN" at the beginning.

Column 2,
Line 60, please replace "twenty-fours" with -- twenty-four hours --.

Column 5,
Line 23, please delete "to".

Signed and Sealed this

Third Day of September, 2002

Attest:

Attesting Officer

JAMES E. ROGAN
*Director of the United States Patent and Trademark Office*